(12) United States Patent
Jiang et al.

(10) Patent No.: US 11,893,913 B2
(45) Date of Patent: Feb. 6, 2024

(54) DISPLAY SUBSTRATE, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaofeng Jiang, Beijing (CN); Linhong Han, Beijing (CN); Huijun Li, Beijing (CN); Huijuan Yang, Beijing (CN); Yu Wang, Beijing (CN); Lu Bai, Beijing (CN); Jie Dai, Beijing (CN); Lulu Yang, Beijing (CN); Yi Qu, Beijing (CN); Siyu Wang, Beijing (CN); Hao Zhang, Beijing (CN); Xin Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 613 days.

(21) Appl. No.: 17/262,826

(22) PCT Filed: Apr. 15, 2020

(86) PCT No.: PCT/CN2020/084885
§ 371 (c)(1),
(2) Date: Jan. 25, 2021

(87) PCT Pub. No.: WO2021/207969
PCT Pub. Date: Oct. 21, 2021

(65) Prior Publication Data
US 2022/0114930 A1    Apr. 14, 2022

(51) Int. Cl.
*H01L 27/02* (2006.01)
*G09G 3/00* (2006.01)
*H10K 59/121* (2023.01)

(52) U.S. Cl.
CPC ......... *G09G 3/006* (2013.01); *H01L 27/0266* (2013.01); *H10K 59/1213* (2023.02)

(58) Field of Classification Search
CPC ......... H01L 23/60; H01L 22/14; H01L 22/34; H01L 27/1259; H01L 27/3276;
(Continued)

(56) References Cited

U.S. PATENT DOCUMENTS 10,706,753 B2 *   7/2020  Lee ................. G02F 1/136213
2004/0217424 A1 * 11/2004  Shih ................ H01L 29/41733
                                              257/E29.117
(Continued)

FOREIGN PATENT DOCUMENTS

CN    107767801 A    3/2018
CN    109427752 A    3/2019
(Continued)

*Primary Examiner* — Eric A. Ward
*Assistant Examiner* — Zachary Taylor Nix
(74) *Attorney, Agent, or Firm* — DINSMORE & SHOHL LLP

(57) ABSTRACT

The present disclosure relates to a display substrate, a display panel and a display device. The display substrate includes: a base substrate including a display area and a peripheral area surrounding the display area; a common electrode located in the peripheral area and surrounding the display area; a panel crack detection line located in the peripheral area and surrounding the display area, wherein the panel crack detection line is located on one side of the common electrode away from the display area; and at least one electrostatic discharge circuit located in the peripheral area, wherein the at least one electrostatic discharge circuit includes at least one first thin film transistor including an (Continued)

active layer, a gate, a source and a drain, the source and the drain are electrically connected to the panel crack detection line, and the gate is electrically connected to the common electrode.

20 Claims, 3 Drawing Sheets

(58) Field of Classification Search
CPC ..... H01L 51/0031; H01L 51/56; G09G 3/006; G09G 2330/12; H10K 71/70; H10K 50/00–88; H10K 59/00–95; H10K 65/00; H10K 85/00–791; H10K 2101/00–90; H10K 2102/00–361; H10K 50/813; H10K 50/822; H10K 59/10–221; G02F 1/1309; B32B 2457/206
See application file for complete search history.

(56) References Cited

U.S. PATENT DOCUMENTS

| | | |
|---|---|---|
| 2014/0176844 A1 | 6/2014 | Yanagisawa |
| 2018/0053792 A1 | 2/2018 | Shin et al. |
| 2019/0066595 A1 | 2/2019 | Kim et al. |
| 2019/0279543 A1 | 9/2019 | Kim et al. |
| 2020/0212132 A1* | 7/2020 | Kim ........................ G09G 3/32 |

FOREIGN PATENT DOCUMENTS

| | | |
|---|---|---|
| CN | 109935571 A | 6/2019 |
| CN | 110136580 A | 8/2019 |

* cited by examiner

# DISPLAY SUBSTRATE, DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2020/084885, filed on Apr. 15, 2020, the disclosure of which is incorporated by reference herein in its entirety.

TECHNICAL FIELD

The present disclosure relates to the field of display technology, and in particular to a display substrate, a display panel and a display device.

BACKGROUND

With the development of Active Matrix Organic Light-Emitting Diode (AMOLED) in the field of display technology, it is very urgent to improve its product yield. Static electricity is one of the important factors leading to a poor product.

SUMMARY

According to one aspect of the present disclosure, a display substrate is provided. The display substrate includes: a base substrate including a display area and a peripheral area surrounding the display area; a common electrode located in the peripheral area and surrounding the display area; a crack detection line located in the peripheral area and surrounding the display area, wherein the crack detection line is located on one side of the common electrode away from the display area; and at least one electrostatic discharge circuit located in the peripheral area, wherein the at least one electrostatic discharge circuit includes at least one first thin film transistor including an active layer, a gate located on one side of the active layer away from the base substrate, and a source and a drain located on one side of the gate away from the base substrate, the source and the drain of the at least one first thin film transistor are electrically connected to the crack detection line, and the gate of the at least one first thin film transistor is electrically connected to the common electrode.

In some embodiments, the display area includes a first boundary, a second boundary, a third boundary, and a fourth boundary; the peripheral area includes a first peripheral area located outside the first boundary, a second peripheral area located outside the second boundary, a third peripheral area located outside the third boundary, and a fourth peripheral area located outside the fourth boundary; the common electrode includes a first portion located in the first peripheral area and a second portion located in the second peripheral area, the third peripheral area and the fourth peripheral area; and the gate of the at least one first thin film transistor is electrically connected to the first portion of the common electrode.

In some embodiments, the display substrate further includes: a plurality of sub-pixels located in the display area; and a unit test circuit located in the first peripheral area and electrically connected to the plurality of sub-pixels and the crack detection line respectively.

In some embodiments, the at least one electrostatic discharge circuit includes two electrostatic discharge circuits located on both sides of the unit test circuit respectively.

In some embodiments, at least a part of the crack detection line located in the first peripheral area is located in the same layer and has the same material as the source and the drain of the at least one first thin film transistor; and at least a part of the crack detection line located in the second peripheral area, the third peripheral area and the fourth peripheral area is located in the same layer and has the same material as the gate of the at least one first thin film transistor.

In some embodiments, the source and the drain of the at least one first thin film transistor are short connected therebetween through a metal layer, and the source and the drain of the at least one first thin film transistor are located in the same layer and have the same material as the metal layer.

In some embodiments, the at least one first thin film transistor includes at least one row of first thin film transistors arranged along an extending direction of the crack detection line, and each row of the first thin film transistors include a plurality of first thin film transistors, wherein the gates of the plurality of first thin film transistors are sequentially connected along an arrangement direction of the row of first thin film transistors, and both sides of the gates of each row of first thin film transistors along an extending direction of the crack detection line are connected to each other.

In some embodiments, the crack detection line includes a first crack detection section and a second crack detection section parallel to each other, the at least one first thin film transistor includes two rows of first thin film transistors both located between the first crack detection section and the second crack detection section, and each row of first thin film transistors include a plurality of first thin film transistors arranged along an extending direction of the first crack detection section or the second crack detection section.

In some embodiments, both sides of the gates of the two rows of first thin film transistors along an extending direction of the crack detection line are connected to each other in an annular shape.

In some embodiments, the display substrate further includes: a first gate insulation layer located on one side of the base substrate adjacent to the gate of the at least one first thin film transistor and covering the active layer of the at least one first thin film transistor; a second gate insulation layer located on one side of the first gate insulation layer away from the base substrate and covering the gate of the at least one first thin film transistor; and an interlayer insulation layer located on one side of the second gate insulation layer away from the base substrate; wherein the source and the drain of the at least one first thin film transistor are located on one side of the interlayer insulation layer away from the base substrate, and connected to the active layer through at least one first via hole penetrating through the interlayer insulation layer, the second gate insulation layer and the first gate insulation layer.

In some embodiments, the display substrate further includes: at least one pattern block located on one side of the crack detection line away from the at least one first thin film transistor and located in the same layer as the active layer of the at least one first thin film transistor, wherein the interlayer insulation layer covers one side of the at least one pattern block away from the base substrate, and a part where the interlayer insulation layer covers the at least one pattern block is provided with at least one second via hole penetrating through the interlayer insulation layer.

In some embodiments, the at least one pattern block includes at least one row of pattern blocks, each row of pattern blocks includes a plurality of pattern blocks arranged along an extending direction of the crack detection line, and the at least one first thin film transistor includes at least one row of first thin film transistors, each row of first thin film transistors include a plurality of first thin film transistors arranged along an extending direction of the crack detection line, and the plurality of pattern blocks are in one-to-one correspondence to the plurality of first thin film transistors.

In some embodiments, the at least one second via hole includes at least one row of second via holes extending along an extending direction of the crack detection line, and each row of second via holes include a plurality of second via holes arranged at intervals along an extending direction of the crack detection line, and at least some of the plurality of second via holes are aligned with at least one first via hole in the at least one first thin film transistor in a direction perpendicular to the crack detection line and parallel to the base substrate.

In some embodiments, the crack detection line includes a first crack detection section and a second crack detection section parallel to each other, and the at least one row of second via holes includes at least one row of second via holes located on one side of the first crack detection section away from the at least one first thin film transistor and at least one row of second via holes located on one side of the second crack detection section away from the at least one first thin film transistor.

In some embodiments, the display substrate further includes a plurality of sub-pixels located in the display area, wherein at least one of the plurality of sub-pixels includes a pixel circuit, and the pixel circuit includes: at least one second thin film transistor located in the display area; wherein the gate of the at least one second thin film transistor is located in the same layer and has the same material as the gate of the at least one first thin film transistor, and the source and the drain of the at least one second thin film transistor are located in the same layer and have the same material as the source and the drain of the at least one first thin film transistor.

In some embodiments, the at least one first thin film transistor and the at least one second thin film transistor are both P-type thin film transistors.

In some embodiments, the number of the first thin film transistors in the at least one first thin film transistor is greater than or equal to 16.

In some embodiments, the voltage of the common electrode is −1~−7V.

In some embodiments, the voltage of the common electrode is −3V.

In some embodiments, a part of the crack detection line located in the first peripheral area is U-shaped or L-shaped, and the U-shaped or L-shaped bent portion has a chamfer.

In another aspect of the present disclosure, a display panel is provided. The display panel includes: the display substrate as described previously.

In another aspect of the present disclosure, a display device is provided. The display device includes: the display panel as described previously.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

DETAILED DESCRIPTION

Figure 1:
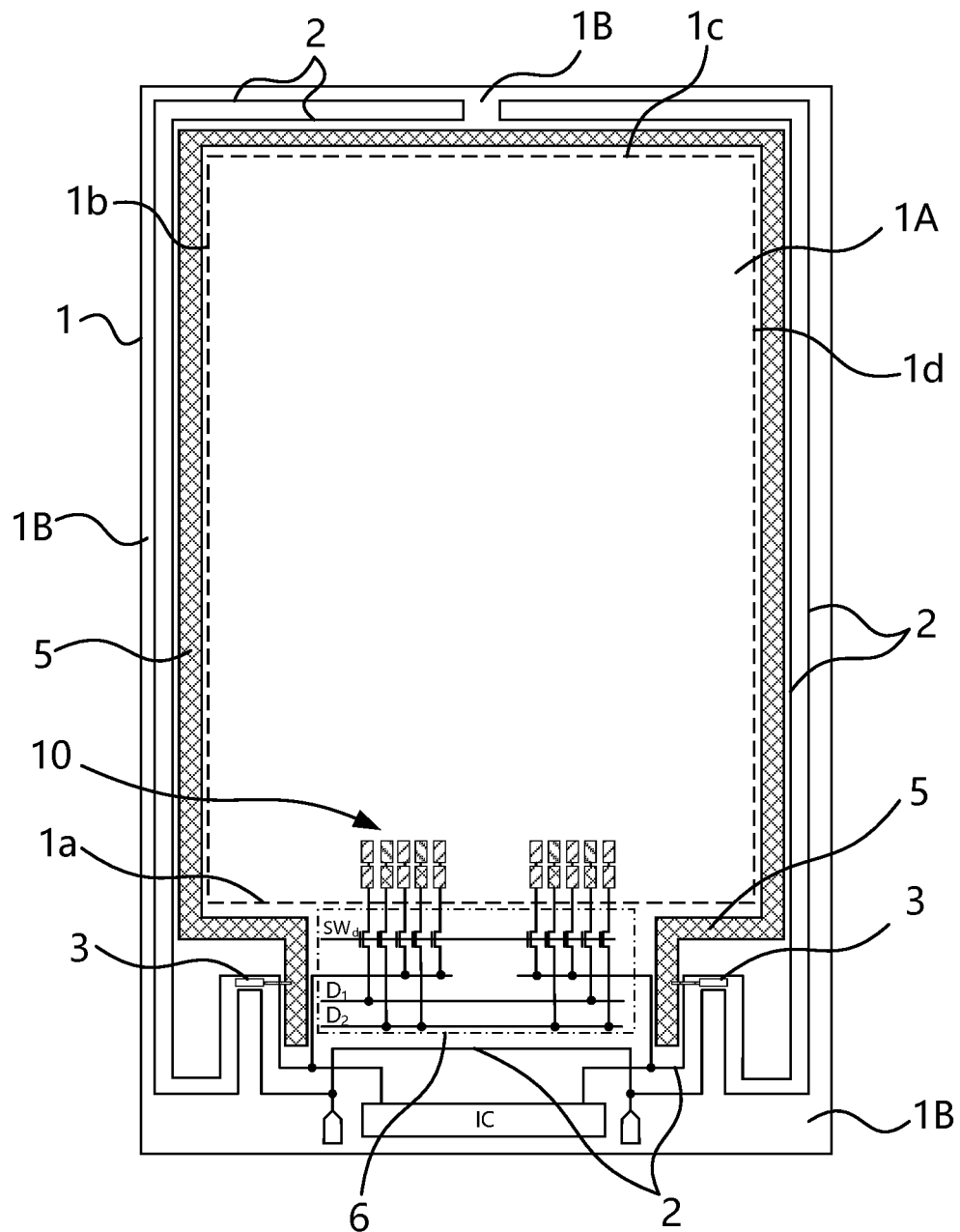
FIG. 1 is a schematic view of an area distribution in an embodiment of the display substrate according to the present disclosure.

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words "first", "second", and similar words used in the present disclosure do not denote any order, quantity or importance, but merely serve to distinguish different parts. Such similar words as "comprising/including" or "containing" mean that the element preceding the word encompasses the elements enumerated after the word, and does not exclude the possibility of encompassing other elements as well. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Since there is a long panel crack detection (PCD) line of the AMOLED display screen, it is easily to accumulate static electricity during processing. If the accumulated static electricity cannot be discharged in time, the static electricity might break down the thin film transistor (TFT) adjacent to the PCD line within the panel or the TFT of the scanning unit, thereby resulting in the failure of individual pixel points to emit light or the failure of an entire panel.

In some related technologies, the static electricity accumulated in the PCD line is discharged by way of layer exchange of traces. The inventors have discovered through studies that, static electricity cannot be completely eliminated by layer exchange of traces. For the multi-layer metal wiring process, when the antenna effect occurs in the lower layer of metal, static electricity may be eliminated by using an upward jumper method. However, when the antenna effect occurs in the highest layer of metal, static electricity cannot be discharged by a jumper.

In view of this, the embodiments of the present disclosure provide a display substrate, an AMOLED display panel, and a display device, which can effectively eliminate static electricity accumulated in the PCD line.

FIG. 1 is a schematic view of an area distribution in an embodiment of the display substrate according to the present disclosure.

Referring to FIG. 1, in some embodiments, the display substrate includes a base substrate 1, a common electrode 5, a panel crack detection (PCD) line 2 and at least one electrostatic discharge circuit 3. The material of the base substrate 1 may be glass, ceramic, polyimide, or the like. The base substrate 1 includes a display area 1A and a peripheral area 1B surrounding the display area 1A. The display substrate may further include a plurality of sub-pixels 10 located in the display area 1A, and each sub-pixel may display any color such as red, green, blue, white and the like, so that the display substrate can present a picture. The peripheral area 1B is located outside the display area 1A (that is, on one side of the display area 1A along a direction away from the display area 1A), and pertains to a non-display area.

In FIG. 1, the display area 1A includes: a first boundary 1a, a second boundary 1b, a third boundary 1c, and a fourth boundary 1d. The first boundary 1a is opposite to the third boundary 1c, and the second boundary 1b is opposite to the fourth boundary 1d. The peripheral area 1B includes: a first peripheral area located outside the first boundary 1a, a second peripheral area located outside the second boundary 1b, a third peripheral area located outside the third boundary 1c, and a fourth peripheral area located outside the fourth boundary 1d.

Referring to FIG. 1, the common electrode 5 is located in the peripheral area 1B and surrounds the display area 1A. Specifically, the common electrode 5 may include a first portion located in the first peripheral area and a second portion located in the second peripheral area, the third peripheral area, and the fourth peripheral area. In FIG. 1, the second portion of the common electrode 5 continuously extends in the second peripheral area, the third peripheral area, and the fourth peripheral area, and extends to the first peripheral area on both sides of the display area 1A respectively.

The PCD line 2 is located in the peripheral area 1B and surrounds the display area 1A, and the PCD line 2 is located on one side of the common electrode 5 away from the display area 1A. In FIG. 1, the PCD line 2 includes two loops. One loop passes through a left half of the first peripheral area, the second peripheral area and a left half of the third peripheral area, and another loop passes through a right half of the first peripheral area, the fourth peripheral area and a right half of the third peripheral area.

At least one electrostatic discharge circuit 3 is also located in the peripheral area 1B, and electrically connected to the common electrode 5 and the PCD line 2 for realizing the electrostatic discharge of the PCD line 2. In FIG. 1, at least one electrostatic discharge circuit 3 is located in the first peripheral area, and includes two electrostatic discharge circuits.

Referring to FIG. 1, in some embodiments, the display substrate further includes a cell test (referred to as CT for short) circuit 6. The CT circuit 6 is located in the first peripheral area and electrically connected to the plurality of sub-pixels 10 and the PCD line 2 respectively. The two electrostatic discharge circuits in FIG. 1 may be located on both sides of the unit test circuit respectively.

The CT circuit 6 may include a plurality of TFTs. The gate of each TFT is connected to the switching signal line $SW_d$, one electrode of the source or drain of the plurality of TFTs is electrically connected to the plurality of sub-pixels 10 respectively, and another electrode of the source or drain of the plurality of TFTs is connected to one end of a loop of the PCD line 2, the first control voltage line $D_1$ and the second control voltage line $D_2$ respectively. For example, the green sub-pixels in the plurality of sub-pixels 10 are connected to one end of a loop of the PCD line 2 through the TFT.

The another end of a loop of the PCD line 2 is connected to the switching voltage signal $V_{GH}$ for turning on the sub-pixel. When there is no crack or only a small crack in the display substrate, disconnection in the loop of the PCD line 2 doesn't occur, the voltage of the PCD line 2 during the test is the same as that of the first control voltage line $D_L$ and that of the second control voltage line $D_2$, which makes each sub-pixel in the display area present a dark state. If there is a large crack in the display substrate, which causes disconnection of the loop of the PCD line 2, the voltage of the PCD line 2 is different from that of the first control voltage line $D_1$ and that of the second control voltage line $D_2$ during the test, so that a sub-pixel (for example, a green sub-pixel) corresponding to the TFT connected to the PCD line 2 will become brighter, which is appeared as a bright green line in the dark state picture in the display area 1A, thereby determining that there is a crack in the display substrate.

Figure 2:
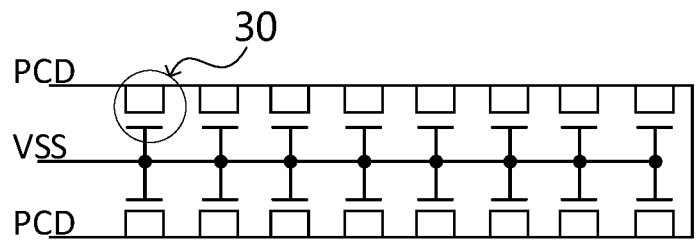
FIG. 2 is a schematic view of a circuit principle in an embodiment of the display substrate according to the present disclosure.
Figure 3:
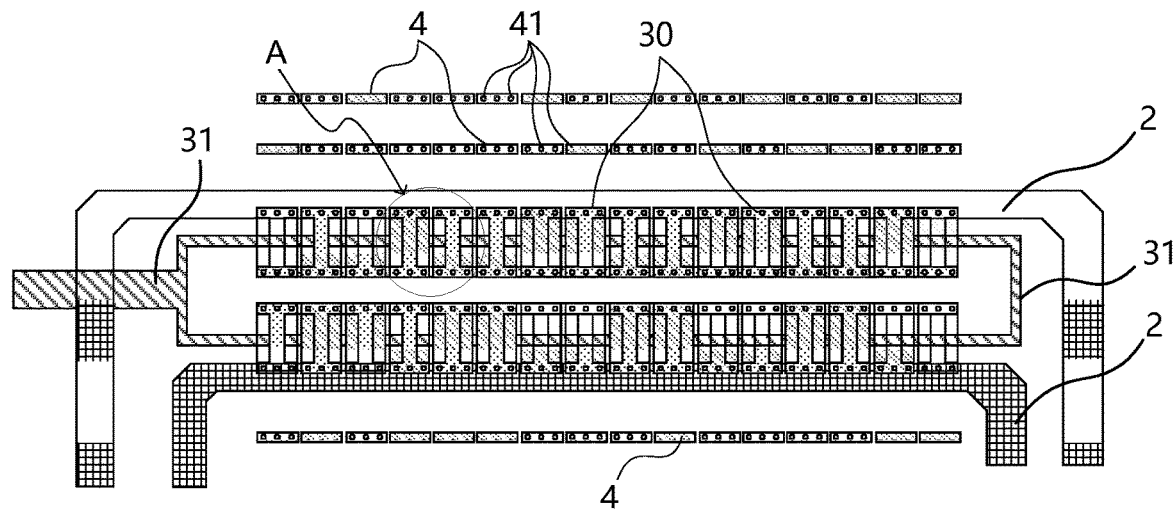
FIG. 3 is a schematic view of a partial layout design of an electrostatic discharge circuit in an embodiment of the display substrate according to the present disclosure.
Figure 4:
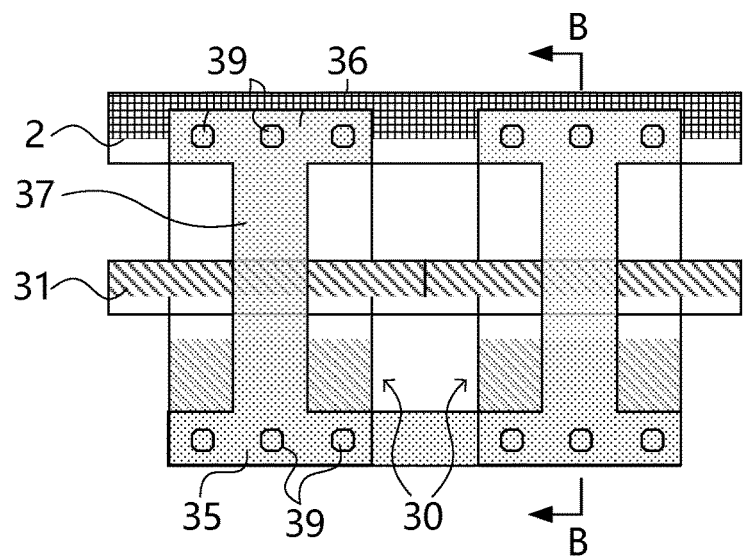
FIG. 4 is an enlarged schematic view of a circle A in FIG. 3.
Figure 5:
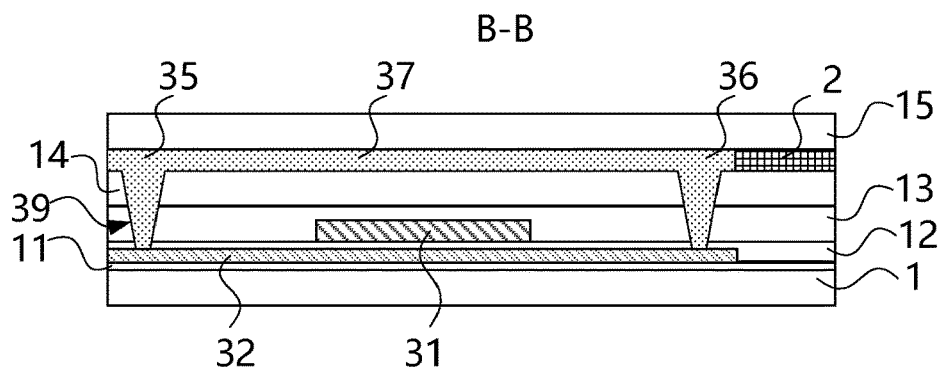
FIG. 5 is a schematic structural view of a B-B section in FIG. 4.

FIG. 2 is a schematic view of a circuit principle in an embodiment of the display substrate according to the present disclosure. FIG. 3 is a schematic view of a partial layout design of an electrostatic discharge circuit 3 in an embodiment of the display substrate according to the present disclosure. FIG. 4 is an enlarged schematic view of a circle A in FIG. 3. FIG. 5 is a schematic structural view of a B-B section in FIG. 4.

Referring to FIGS. 2 to 5, in some embodiments, at least one electrostatic discharge circuit 3 includes at least one first TFT 30. The at least one first TFT 30 includes an active layer 32, a gate 31 located on one side of the active layer 32 away from the base substrate 1, and a source 35 and a drain 36 located on one side of the gate 31 away from the base substrate 1. The source 35 and the drain 36 of the at least one first TFT 30 are electrically connected to the PCD line 2. The gate 31 of the at least one first TFT 30 is electrically connected to the common electrode 5.

The active layer 32 may use a polysilicon material. The source 35 and the drain 36 of the at least one first TFT 30 are electrically connected to the PCD line 2, and electrically connected to the active layer 32. The gate 31 of the at least one first TFT 30 is electrically connected to the common electrode 5. In some embodiments, the common electrode 5 may be set to a negative constant voltage, such as −1 to −7V, and may further be optionally set to −3V.

Such connection method makes at least one first TFT 30 in the electrostatic discharge circuit 3 equivalent to a capacitor, wherein the source 35 and drain 36 of the first TFT 30 and the active layer 32 electrically connected to both of the source 35 and drain 36, which are equivalent to one pole plate of the capacitor, while the gate 31 of the first TFT 30 is equivalent to another pole plate of the capacitor. Since the gate 31 is electrically connected to the common electrode 5, the capacitor pole plate corresponding to the gate 31 is continuously at a low potential. When a positive or negative static charge is formed in the PCD line 2, the static charge may charge or discharge the capacitor pole plate corresponding to the source 35, the drain 36 and the active layer 32 of the first TFT 30, so as to implement releasing the electrostatic charge generated by the PCD line 2 due to an antenna effect, thereby effectively protecting the display substrate and the AMOLED display panel using the display substrate from being easily broken down by static electricity, and further improving the overall yield of the product.

In FIG. 3, a part of the PCD line 2 is bent into a U shape in the first peripheral area, and the first TFT 30 in the electrostatic discharge circuit 3 is located at a bottom area of the U shape. The U-shaped bent portion may be provided with a chamfer to reduce the risk of tip discharge. The at least one first TFT 30 includes at least one row of first TFTs 30, and each row of first TFTs 30 includes a plurality of first TFTs 30 arranged along an extending direction of the PCD line 2. The gates 31 of the plurality of first TFTs 30 are sequentially connected along an arrangement direction of the row of first TFTs 30, and both sides of the gates 31 of each row of first TFTs 30 along an extending direction of the PCD line 2 are connected to each other.

The number of the first TFTs 30 may be set according to the layout space on the display substrate. In some embodiments, the number of the first TFTs 30 is greater than or equal to 16. According to needs, the first TFTs 30 may also be manufactured in the form of a smaller number and a larger size.

In FIGS. 2 and 3, the PCD line 2 includes a first PCD section and a second PCD section parallel to each other, and the first PCD section and the second PCD section are located in the same PCD loop. The at least one first TFT 30 includes two rows of first TFTs 30, both of which are located between the first PCD section and the second PCD section. Each row of first TFTs 30 includes a plurality of first TFTs 30 arranged along an extending direction of the first PCD section or the second PCD section.

Referring to FIGS. 2, 4, and 5, in some embodiments, the source 35 and the drain 36 of the at least one first TFT 30 are short connected therebetween through the metal layer 37, and the source 35 and the drain 36 of the at least one first TFT 30 are located in the same layer and have the same material as the metal layer 37. For example, the source 35 and the drain 36 of the first TFT 30 and the metal layer 37 may use conductive materials such as molybdenum, copper, aluminum, gold, silver, or titanium. In this way, the source 35, the drain 36 and the metal layer 37 may be formed by the same patterning process to simplify the machining process. The same material and the same layer mentioned here and later may be a layer structure formed by using the same film forming process to form a film layer for forming a specific pattern, and then using the same mask to pattern the film layer through a single patterning process. Depending on different specific patterns, a single patterning process may include multiple exposing, developing or etching processes, and the specific pattern in the formed layer structure may be continuous or discontinuous. These specific patterns might also be at different heights or have different thicknesses.

Referring to FIG. 5, in some embodiments, while static electricity of the PCD line 2 is released by using the electrostatic discharge circuit 3, the layer exchange of traces technology of the PCD line 2 is used. In other words, at least a part of the PCD line 2 located in the first peripheral area are in the same layer and have the same material as the source 35 and the drain 36 of the at least one first TFT 30, so that at least a part of the PCD line 2 in this area can be formed by the same patterning process as the source 35 and the drain 36 of the at least one first TFT 30 to simplify the manufacturing process. In addition, at least a part of the PCD line 2 located in the second peripheral area, the third peripheral area and the fourth peripheral area is located in the same layer and have the same material as the gate 31 of the at least one first TFT 30. Therefore, the conductor area with an antenna effect is reduced by an interlayer jumper of the PCD line 2, and the static electricity accumulated on the PCD line 2 is discharged into the first TFT 30.

In FIG. 3, the gates 31 of each row of first TFTs 30 may be sequentially connected along an arrangement direction of the row of first TFTs 30. Both sides of the gates 31 of each row of first TFTs 30 along an arrangement direction of the row of first TFTs 30 are connected to each other. For an electrostatic discharge circuit 3 having two rows of first TFTs 30, the gates 31 of two rows of first TFTs 30 after connected may be in an annular shape, and are led out to be electrically connected to the common electrode 5.

Referring to FIG. 5, in some embodiments, the display substrate further includes: a first gate insulation layer 12, a second gate insulation layer 13 and an interlayer insulation layer 14. The first gate insulation layer 12 is located on one side of the base substrate 1 adjacent to the gate 31 of the at least one first TFT 30 and covers the active layer 32 of the at least one first TFT 30. The second gate insulation layer 13 is located on one side of the first gate insulation layer 12 away from the base substrate 1 and covers the gate 31 of the at least one first TFT 30. The interlayer insulation layer 14 is located on one side of the second gate insulation layer 13 away from the base substrate 1. In FIG. 5, a buffer layer 11 may be provided on the base substrate 1, and the active layer 32 may be disposed on the surface of the buffer layer 11. In other embodiments, the active layer 32 may be directly disposed on the surface of the base substrate 1.

The source 35 and the drain 36 are disposed on one side of the interlayer insulation layer 14 away from the base substrate 1, and electrically connected to the active layer 32 through at least one first via hole 39 penetrating through the interlayer insulation layer 14, the second gate insulation layer 13, and the first gate insulation layer 12. In FIG. 4, the source 35 and the drain 36 of each first TFT 30 are all electrically connected to the active layer 32 through three first via holes 39. The display substrate further includes a planarization layer 15 located on one side of the interlayer insulation layer 14 away from the base substrate 1, and the planarization layer 15 covers the source 35 and the drain 36 of the at least one first TFT 30.

Referring to FIG. 1, in some embodiments, the display substrate further includes: a plurality of sub-pixels 10 located in the display area 1A, wherein at least one of the plurality of sub-pixels 10 includes a pixel circuit. The pixel circuit includes at least one second TFT. In some embodiments, the gate 31 of the at least one first TFT 30 is located in the same layer and has the same material as the gate of the at least one second TFT, and the source 35 and drain 36 of the at least one first TFT 30 are located in the same layer and have the same material as the source and drain of the at least one second TFT. In this way, the source 35 and the drain 36 in the first TFT 30 in the electrostatic discharge circuit 3 can be formed by the same patterning process as the source and drain of the second TFT in the display area 1A. The gate 31 in the first TFT 30 of the electrostatic discharge circuit 3 can be formed by the same patterning process as the gate of the second TFT in the display area 1A, thereby simplifying the machining process.

In some embodiments, the second TFT in the display area 1A is a P-type TFT. In order to simplify the machining process, at least one first TFT 30 may also be a P-type TFT to facilitate the formation using the same patterning process. In other embodiments, the first TFT 30 may also be an N-type TFT.

When a plurality of second TFTs are formed, the source and drain of each second TFT are connected to the active layer 32 through via holes 39, which makes the characteristics of each second TFT affected by the via holes 39 of other second TFTs around it. Referring to FIG. 3, in some embodiments, the display substrate further includes: at least one pattern block 4 located on one side of the PCD line 2 away from the at least one first TFT 30 and located in the same layer as the active layer 32 of the at least one first TFT 30. The pattern block 4 and the active layer 32 may both be formed of a polysilicon material to simplify the machining process.

The interlayer insulation layer 14 covers one side of the at least one pattern block 4 away from the base substrate 1, and the part where the interlayer insulation layer 14 covers the at least one pattern block 4 is provided with at least one second via hole 41 penetrating through the interlayer insulation layer 14. By forming the second via hole 41 around the first TFT 30, it is possible to reduce a degree of difference between an ambient via hole environment around the first TFT 30 and an ambient via hole environment around the second TFT within the display area 1A, thereby allowing the characteristics of the first TFT 30 to tend to be consistent with the characteristics of the second TFT in the display area 1A.

In addition, the area corresponding to the pattern block 4 does not include the gate 31, the source 35, and the drain 36 in the first TFT 30. By providing the second via hole 41, it is possible to enable this area to be exposed relatively consistent with the area where the first TFT 30 is provided, thereby ensuring an etching uniformity of the electrostatic discharge circuit 3.

Referring to FIG. 3, in some embodiments the at least one pattern block 4 includes at least one row of pattern blocks 4, wherein each row of pattern blocks 4 include a plurality of pattern blocks 4 arranged along an extending direction of the PCD line 2. The pattern block 4 may be made of a polysilicon material. The plurality of pattern blocks 4 in each row of pattern blocks 4 may be in one-to-one correspondence to the plurality of first TFTs 30. In FIG. 3, the number of pattern blocks 4 in each row of pattern blocks 4 is equal to the number of first TFTs 30 in an adjacent row of first TFTs 30. Each pattern block 4 may correspond to at least one second via hole 41, for example, three second via holes 41. In this way, it is possible to reduce the degree of difference between an ambient via hole environment of each first TFT 30 and an ambient via hole environment of the second TFT within the display area 1A.

The at least one second via hole 41 includes at least one row of second via holes 41 extending along an extending direction of the PCD line 2, wherein each row of second via holes 41 include a plurality of second via holes 41 arranged at intervals along an extending direction of the PCD line 2. At least a part of the plurality of second via holes 41 are aligned with the at least one first via hole 39 in the at least one first TFT 30 in a direction perpendicular to the PCD line 2 and parallel to the base substrate 1. In this way, the ambient via hole environment of the first via hole 39 in the first TFT 30 can be more similar to that of the second TFT in the display area 1A, so that the characteristics of the first TFT 30 are more consistent with those of the second TFT in the display area 1A.

Referring to FIGS. 1 and 3, in some embodiments, the PCD line 2 includes a first PCD section and a second PCD section that are parallel to each other, and the at least one row of second via holes 41 include at least one row of second via holes 41 located on one side of the first PCD section away from the at least one first TFT 30 and at least one row of second via holes 41 located on one side of the second PCD section away from the at least one first TFT 30. The first PCD section is located on one side of the second PCD section adjacent to the display area 1A, and the two rows of first TFTs 30 are located between the first PCD section and the second PCD section, and electrically connected to the first PCD section and the second PCD section respectively. Two rows of pattern blocks 4 and second via holes 41 may be provided on one side of the first PCD section adjacent to the display area 1A, and one row of pattern blocks 4 and second via holes 41 may be provided on one side of the second PCD section away from the display area 1A.

Figure 6:
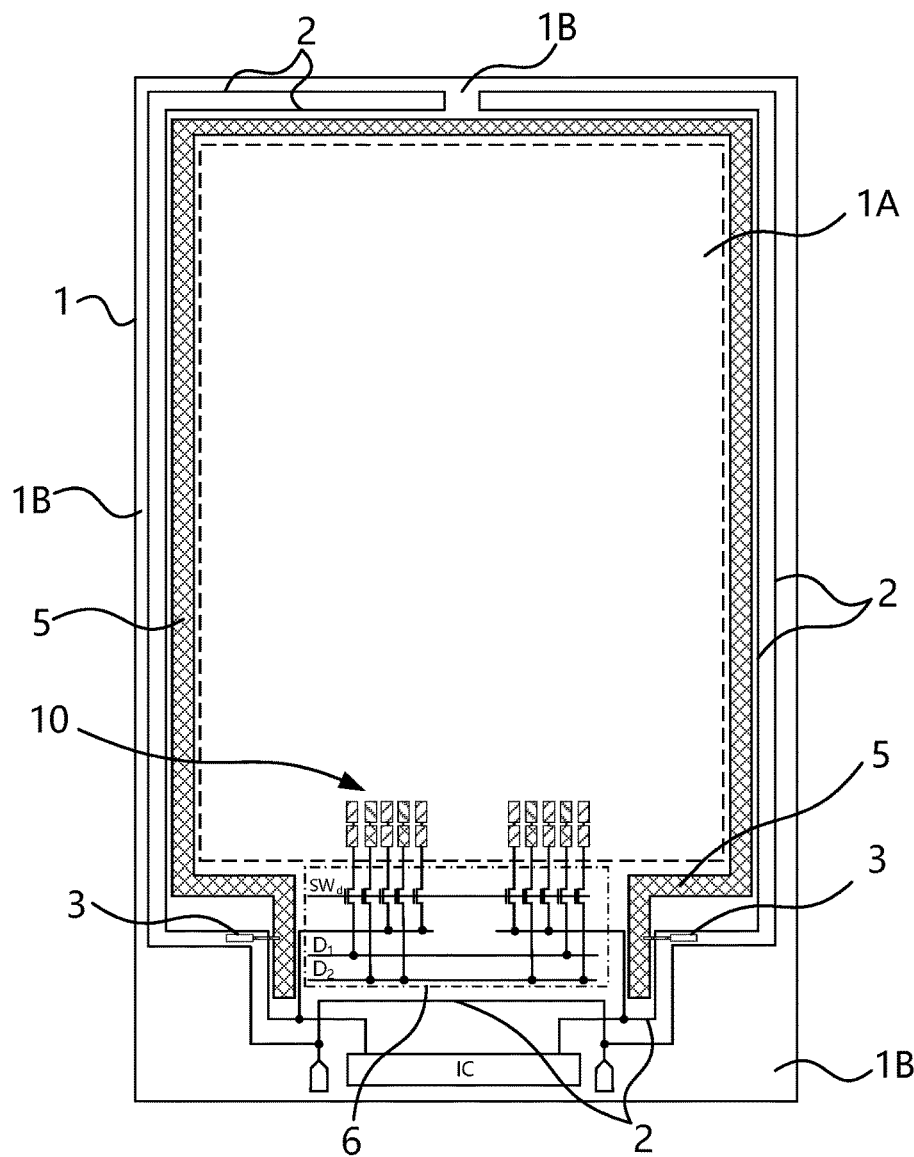
FIG. 6 is a schematic view of an area distribution in another embodiment of the display substrate according to the present disclosure.
Figure 7:
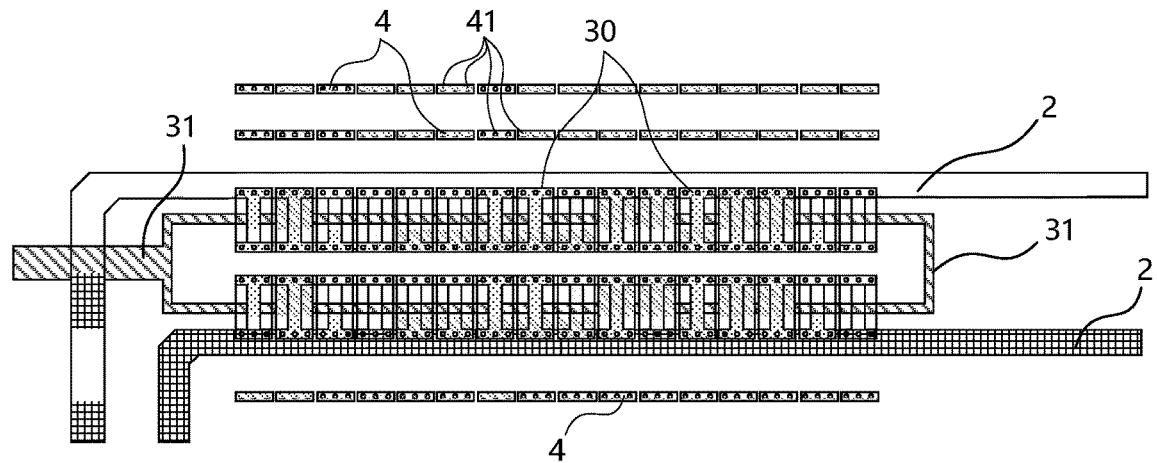
FIG. 7 is a schematic view of a partial layout design of an electrostatic discharge circuit in another embodiment of the display substrate according to the present disclosure.

FIG. 6 is a schematic view of an area distribution in another embodiment of the display substrate according to the present disclosure. FIG. 7 is a schematic view of a partial layout design of an electrostatic discharge circuit in another embodiment of the display substrate according to the present disclosure.

Referring to FIGS. 6 and 7, compared with the foregoing embodiments of the display substrate of the present disclosure, in some embodiments, a part of the PCD line 2 is bent into an L shape in the first peripheral area, and the first TFT 30 in the electrostatic discharge circuit 3 is located in a side area of the L shape. The L-shaped bent portion may be provided with a chamfer to reduce the risk of tip discharge.

The above-described embodiments of the display substrate of the present disclosure may be applied to various display panels and display devices. Therefore, the present disclosure also provides a display panel, such as an AMOLED display panel, which includes the aforementioned display substrate. The present disclosure also provides a display device including the aforementioned display panel. The display device may be any product or member having a display function, such as a mobile phone, a tablet computer, a television, a display, a notebook computer, a digital photo frame, a navigator, and the like.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display substrate comprising:
   a base substrate comprising a display area and a peripheral area surrounding the display area;
   a common electrode located in the peripheral area and surrounding the display area;
   a panel crack detection line located in the peripheral area and surrounding the display area, wherein the panel crack detection line is located on one side of the common electrode away from the display area; and
   at least one electrostatic discharge circuit located in the peripheral area,
   wherein the at least one electrostatic discharge circuit comprises at least one first thin film transistor comprising an active layer, a gate located on one side of the active layer away from the base substrate, and a source and a drain located on one side of the gate away from the base substrate, the source and the drain of the at least one first thin film transistor are electrically connected to the panel crack detection line, and the gate of the at least one first thin film transistor is electrically connected to the common electrode.

2. The display substrate according to claim 1, wherein:
   the display area comprises a first boundary, a second boundary, a third boundary, and a fourth boundary;
   the peripheral area comprises a first peripheral area located outside the first boundary, a second peripheral area located outside the second boundary, a third peripheral area located outside the third boundary, and a fourth peripheral area located outside the fourth boundary;
   the common electrode comprises a first portion located in the first peripheral area and a second portion located in the second peripheral area, the third peripheral area and the fourth peripheral area; and
   the gate of the at least one first thin film transistor is electrically connected to the first portion of the common electrode.

3. The display substrate according to claim 2, further comprising:
   a plurality of sub-pixels located in the display area; and
   a unit test circuit located in the first peripheral area and electrically connected to the plurality of sub-pixels and the panel crack detection line respectively.

4. The display substrate according to claim 3, wherein the at least one electrostatic discharge circuit comprises two electrostatic discharge circuits located on both sides of the unit test circuit respectively.

5. The display substrate according to claim 2, wherein:
   at least a part of the panel crack detection line located in the first peripheral area is located in the same layer and has the same material as the source and the drain of the at least one first thin film transistor; and
   at least a part of the panel crack detection line located in the second peripheral area, the third peripheral area and the fourth peripheral area is located in the same layer and has the same material as the gate of the at least one first thin film transistor.

6. The display substrate according to claim 2, wherein a part of the panel crack detection line located in the first peripheral area is U-shaped or L-shaped, and the U-shaped or L-shaped bent portion has a chamfer.

7. The display substrate according to claim 1, wherein the source and the drain of the at least one first thin film transistor are short connected therebetween through a metal layer, and the source and the drain of the at least one first thin film transistor are located in the same layer and have the same material as the metal layer.

8. The display substrate according to claim 1, wherein the at least one first thin film transistor comprises at least one row of first thin film transistors arranged along an extending direction of the panel crack detection line, and each row of the first thin film transistors comprise a plurality of first thin film transistors, wherein the gates of the plurality of first thin film transistors are sequentially connected along an arrangement direction of the row of first thin film transistors, and both sides of the gates of each row of first thin film transistors along an extending direction of the panel crack detection line are connected to each other.

9. The display substrate according to claim 8, wherein the panel crack detection line comprises a first crack detection section and a second crack detection section parallel to each other, the at least one first thin film transistor comprises two rows of first thin film transistors both located between the first crack detection section and the second crack detection section, and each row of first thin film transistors comprise a plurality of first thin film transistors arranged along an extending direction of the first crack detection section or the second crack detection section.

10. The display substrate according to claim 9, wherein both sides of the gates of the two rows of first thin film transistors along an extending direction of the panel crack detection line are connected to each other in an annular shape.

11. The display substrate according to claim 10, further comprising:
    at least one pattern block located on one side of the panel crack detection line away from the at least one first thin film transistor and located in the same layer as the active layer of the at least one first thin film transistor,
    wherein the interlayer insulation layer covers one side of the at least one pattern block away from the base substrate, and a part where the interlayer insulation layer covers the at least one pattern block is provided with at least one second via hole penetrating through the interlayer insulation layer.

12. The display substrate according to claim 11, wherein the at least one pattern block comprises at least one row of pattern blocks, each row of pattern blocks comprises a plurality of pattern blocks arranged along an extending direction of the panel crack detection line, and the at least one first thin film transistor comprises at least one row of first thin film transistors, each row of first thin film transistors comprise a plurality of first thin film transistors arranged along an extending direction of the panel crack detection line, and the plurality of pattern blocks are in one-to-one correspondence to the plurality of first thin film transistors.

13. The display substrate according to claim 11, wherein the at least one second via hole comprises at least one row of second via holes extending along an extending direction of the panel crack detection line, and each row of second via holes comprise a plurality of second via holes arranged at intervals along an extending direction of the panel crack detection line, and at least a part of the plurality of second via holes are aligned with at least one first via hole in the at least one first thin film transistor in a direction perpendicular to the panel crack detection line and parallel to the base substrate.

14. The display substrate according to claim 13, wherein the panel crack detection line comprises a first crack detection section and a second crack detection section parallel to each other, and the at least one row of second via holes comprises at least one row of second via holes located on one side of the first crack detection section away from the at least one first thin film transistor and at least one row of second via holes located on one side of the second crack detection section away from the at least one first thin film transistor.

15. The display substrate according to claim 1, further comprising:
 a first gate insulation layer located on one side of the base substrate adjacent to the gate of the at least one first thin film transistor and covering the active layer of the at least one first thin film transistor;
 a second gate insulation layer located on one side of the first gate insulation layer away from the base substrate and covering the gate of the at least one first thin film transistor; and
 an interlayer insulation layer located on one side of the second gate insulation layer away from the base substrate;
 wherein the source and the drain of the at least one first thin film transistor are located on one side of the interlayer insulation layer away from the base substrate, and connected to the active layer through at least one first via hole penetrating through the interlayer insulation layer, the second gate insulation layer and the first gate insulation layer.

16. The display substrate according to claim 1, further comprising a plurality of sub-pixels located in the display area, wherein at least one of the plurality of sub-pixels comprises a pixel circuit, and the pixel circuit comprises:
 at least one second thin film transistor located in the display area;
 wherein the gate of the at least one second thin film transistor is located in the same layer and has the same material as the gate of the at least one first thin film transistor, and the source and the drain of the at least one second thin film transistor are located in the same layer and have the same material as the source and the drain of the at least one first thin film transistor.

17. The display substrate according to claim 16, wherein the at least one first thin film transistor and the at least one second thin film transistor are both P-type thin film transistors.

18. The display substrate according to claim 1, wherein the voltage of the common electrode is −1~−7V.

19. A display panel comprising the display substrate according to claim 1.

20. A display device comprising the display panel according to claim 19.

* * * * *